United States Patent
Choi

(10) Patent No.: US 10,802,759 B2
(45) Date of Patent: Oct. 13, 2020

(54) MEMORY SYSTEM INCLUDING MEMORY DEVICE AND MEMORY CONTROLLER, AND OPERATING METHOD THEREOF

(71) Applicant: SK hynix Inc., Gyeonggi-do (KR)

(72) Inventor: Hae-Rang Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/234,768

(22) Filed: Dec. 28, 2018

(65) Prior Publication Data
US 2019/0294374 A1  Sep. 26, 2019

(30) Foreign Application Priority Data
Mar. 26, 2018  (KR) .......... 10-2018-0034372

(51) Int. Cl.
| | |
|---|---|
| *G11C 29/00* | (2006.01) |
| *G06F 3/06* | (2006.01) |
| *G11C 11/408* | (2006.01) |
| *G11C 11/4091* | (2006.01) |
| *G11C 11/4096* | (2006.01) |
| *G11C 29/52* | (2006.01) |
| *G06F 12/06* | (2006.01) |
| *G06F 11/10* | (2006.01) |

(52) U.S. Cl.
CPC .......... *G06F 3/0659* (2013.01); *G06F 3/0619* (2013.01); *G06F 3/0673* (2013.01); *G06F 11/1068* (2013.01); *G06F 12/0646* (2013.01); *G11C 11/4087* (2013.01); *G11C 11/4091* (2013.01); *G11C 11/4096* (2013.01); *G11C 29/52* (2013.01); *G06F 2212/1032* (2013.01)

(58) Field of Classification Search
CPC .... G06F 3/0659; G06F 3/0619; G06F 3/0673; G06F 12/0646; G11C 11/4087; G11C 11/4091; G11C 11/4096; G11C 11/1068; G11C 29/52
See application file for complete search history.

(56) References Cited

U.S. PATENT DOCUMENTS

| | | | |
|---|---|---|---|
| 2004/0037112 A1* | 2/2004 | Ooishi | ............... G11C 11/16 365/185.09 |
| 2015/0242269 A1* | 8/2015 | Pelley | ............. G06F 11/1048 714/764 |

FOREIGN PATENT DOCUMENTS

| | | |
|---|---|---|
| KR | 10-2001-0083353 | 9/2001 |
| KR | 10-2012-0126437 | 11/2012 |
| KR | 10-2013-0111074 | 10/2013 |

OTHER PUBLICATIONS

Jungwhan Choi et al, Multiple Clone Row DRAM_ A Low Latency and Area Optimized DRAM, 2015 ACM/IEEE 42nd Annual International Symposium on Computer Architecture (ISCA), Jun. 13-17, 2015, pp. 223-234, IEEE, Portland, OR, USA.

(Continued)

*Primary Examiner* — Samir W Rizk
(74) *Attorney, Agent, or Firm* — IP & T Group LLP

(57) ABSTRACT

A memory system includes a memory device including a plurality of memory cells, and a memory controller suitable for generating a second address based on a first address indicating a defective memory cell, among the plurality of memory cells, and sequentially transmitting the first address and a first command corresponding to the first address, and the second address and a second command corresponding to the second address to the memory device, during write and read operations of the defective memory cell.

19 Claims, 4 Drawing Sheets

(56) References Cited

OTHER PUBLICATIONS

Kinam Kim et al., A New Investigation of Data Retention Time in Truly Nanoscaled DRAMs, IEEE Electron Device Letters, vol. 30, No. 8, Aug. 2009, pp. 846-848.
Jamie Liu et al., RAIDR: Retention-Aware Intelligent DRAM Refresh, Proceedings of the 39th Annual International Symposium on Computer Architecture (ISCA '12), Jun. 9-13, 2012, pp. 1-12, IEEE, Portland, OR, USA.
Sung-Kye Park, Technology scaling challenge and future prospects of DRAM and NAND flash memory, 2015 IEEE International Memory Workshop (IMW), May 17-20, 2015, IEEE, Monterey, CA, USA.
Ishwar Bhati et al., DRAM Refresh Mechanisms, Penalites, and Trade-Offs, IEEE Transactions on Computers, vol. 65, No. 1, Jan. 2016, pp. 108-121.

\* cited by examiner

MEMORY SYSTEM INCLUDING MEMORY DEVICE AND MEMORY CONTROLLER, AND OPERATING METHOD THEREOF

CROSS-REFERENCE TO RELATED APPLICATION

This application claims priority under 35 U.S.C. § 119 to Korean Patent Application No. 10-2018-0034372, filed on Mar. 26, 2018, in the Korean Intellectual Property Office, the disclosure of which is incorporated herein by reference in its entirety.

BACKGROUND

1. Field

Various embodiments of the present invention relate to a memory system, and more particularly, to a memory system capable of repairing defective memory cells of a memory device and an operating method of the memory system.

2. Description of the Related Art

A memory system is used as main memory or auxiliary memory for various consumer or industrial electronic devices such as a computer, a mobile phone, a portable digital assistant (PDA), a digital camera, a game machine, a navigation device and the like. A memory device implementing the memory system is chiefly classified as either a volatile memory device such as a dynamic random access memory (DRAM) or a static RAM (SRAM), or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase change random access memory (PCRAM), a magnetic RAM (MRAM), a resistive RAM (RRAM), or a flash memory.

A volatile memory device, e.g., a dynamic random access memory (DRAM), is comprised of a plurality of memory cells that are arrayed in the form of a matrix. As the capacity of a memory device increases and the dimension of a fabricated memory device shrinks, the number of defective memory cells among the memory cells increases as well. In general, defective memory cells may include failed memory cells and weak memory cells.

Failed memory cells may be defined as memory cells that do not function in terms of hardware. Failed memory cells are generally defined as memory cells that do not operate due to a defect that occurred during the semiconductor fabrication process, such as a memory cell of which the connection line is short-circuited. In order to repair or compensate for the failed memory cells, the DRAM includes, together with normal memory cells, redundancy memory cells to replace the failed memory cells.

Weak memory cells may be defined as memory cells that do not function in terms of software. For example, a weak memory cell has a low data retention time, e.g., less than a reference time. Weak memory cells may operate, to some extent, quite close to normal memory cells. However, if weak memory cells are used without being replaced with redundancy memory cells, the operational reliability of the DRAM may deteriorate. If weak memory cells are replaced with the redundancy memory cells, the repair efficiency and manufacturing yield of the DRAM may be reduced.

Recently, data retention characteristics of a memory cell are decreasing due to the trend of low-voltage high-speed operation and shrinking fabrication dimensions that may also lead to an increase in the number of weak memory cells. Thus, there has been and continues to be a demand for detecting and efficiently repairing weak memory cells in a memory system, as well as in a memory device of such system.

SUMMARY

Various embodiments of the present invention are directed to a memory system capable of compensating for degraded characteristics of a defective memory cell by writing and reading data to and from the defective memory cell together with another memory cell of a memory device, and an operation method of the memory system.

In accordance with an embodiment of the present invention, a memory system includes: a memory device including a plurality of memory cells; and a memory controller suitable for generating a second address based on a first address indicating a defective memory cell, among the plurality of memory cells, and sequentially transmitting the first address and a first command corresponding to the first address, and the second address and a second command corresponding to the second address to the memory device, during write and read operations of the defective memory cell.

In accordance with an embodiment of the present invention, an operating method of a memory system includes: generating a second address based on a first address indicating a defective memory cell among a plurality of memory cells in a memory device; sequentially transmitting the first address and a first command corresponding to the first address, and the second address and a second command corresponding to the second address to the memory device; and writing and reading data to and from the defective memory cell in response to the first address and command and the second address and command which are sequentially inputted.

In accordance with an embodiment of the present invention, a memory system includes: a memory device including a plurality of memory cells; and a memory controller suitable for: detecting a defective memory cell among the plurality of memory cells; and accessing the defective memory cell and another memory cell, among the plurality of memory cells, in response to a command for accessing the defective memory cell, wherein the defective memory cell and the another memory cell share the same bit line or the same sense amplifier, and wherein the defective memory cell and the another memory cell are on different word lines in the memory device.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The disclosed embodiments presented are merely examples and are not intended to limit the scope of the invention. Also, reference to "an embodiment" or the like is not necessarily to only one embodiment, and different references to any such phrase are not necessarily to the same embodiment(s).

Moreover, it is noted that the terminology used herein is for the purpose of describing embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed as a second or third element in another instance without departing from the spirit and scope of the present invention.

The drawings are not necessarily to scale and, in some instances, proportions may have been exaggerated in order to clearly illustrate features of the illustrated embodiments.

Figure 1:
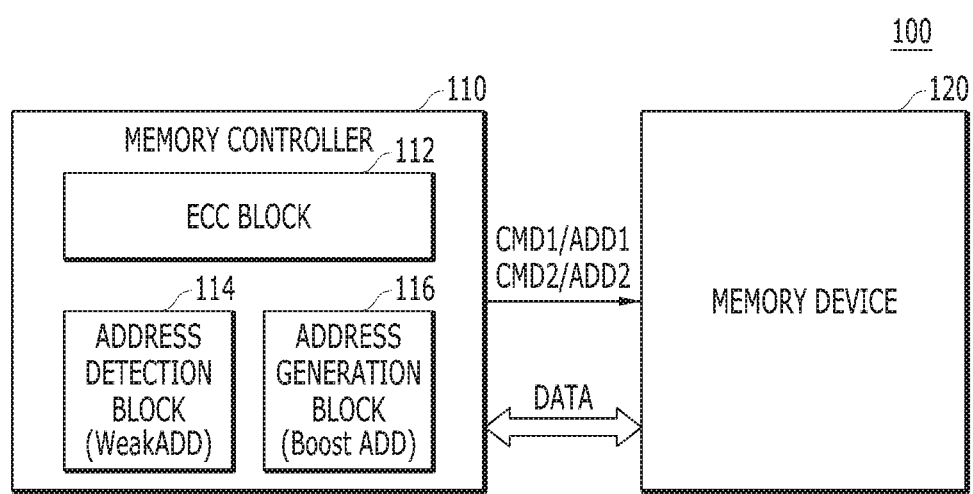
FIG. 1 is a block diagram illustrating a memory system in accordance with an embodiment of the present invention.

FIG. 1 is a block diagram illustrating a memory system 100 in accordance with an embodiment of the present invention. Referring to FIG. 1, the memory system 100 may include a memory controller 110, and a memory device 120.

The memory controller 110 may control write and read operations of the memory device 120. In the write operation, the memory controller 110 may store data DATA requested from a host (not illustrated) in the memory device 120. In the read operation, the memory controller 110 may provide the data DAT stored in the memory device 120 to the host. The memory controller 110 may generate a command and an address to control the write and read operations and entire operations of the memory device 120.

The memory device 120 may include a plurality of memory cells. For example, the memory device 120 includes a dynamic random access memory (DRAM), which is a volatile memory device.

The memory controller 110 may generate a boost address (Boost ADD) based on a weak address (Weak ADD) indicating a defective memory cell, i.e., a weak memory cell among the memory cells included in the memory device 120. Hereinafter, the weak address (Weak ADD) and the boost address (Boost ADD) are referred to as a "first address ADD1" and a "second address ADD2", respectively.

During the write and read operations of the defective memory cell, the memory controller 110 may transmit the first address ADD1 and a first command CMD1 corresponding thereto, i.e., an active command to the memory device 120. In addition, the memory controller 110 may sequentially transmit the second address ADD2 and a second command CMD2 corresponding thereto, i.e., an active command to the memory device 120. Timing of transmitting the addresses and commands from the memory controller 110 to the memory device 120 will be described in detail with reference to FIG. 3.

The first and second commands CMD1 and CMD2 may include flag information indicating whether the addresses ADD1 and ADD2 transmitted together with the commands are the weak address or the boost address. The memory controller 110 may set the flag information of the first and second commands CMD1 and CMD2 to a set state and a reset state, respectively. For example, the memory controller 110 combines signals inputted through a plurality of pins to transmit the commands to the memory device 120, and may set the flag information based on signals inputted through some pins that are not used.

Figure 2:
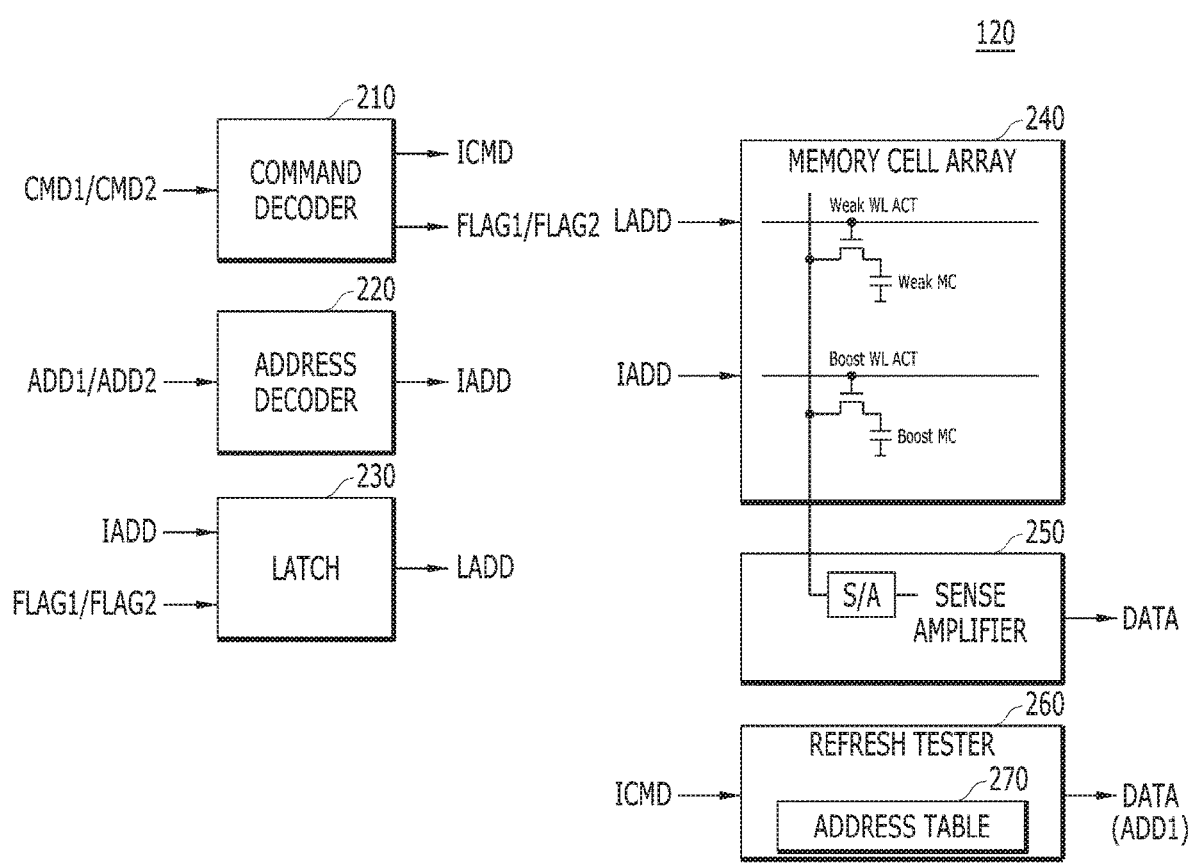
FIG. 2 is a block diagram illustrating a memory device in accordance with an embodiment of the present invention.

According to embodiments of the present invention, the first address ADD1 indicating the defective memory cell may be detected by the memory controller 110 or the memory device 120. FIG. 1 illustrates a case where the first address ADD1 is detected by the memory controller 110. FIG. 2 illustrates a case where the first address ADD1 is detected by the memory device 120.

The memory controller 110 may detect and correct an error of data stored in the memory device 120 through an error correction code (ECC) operation. To this end, the memory controller 110 may include an ECC block 112. The ECC block 112 may perform an ECC encoding operation on the data that is written to the memory device 120. Further, the ECC block 112 may perform an ECC decoding operation on the data that is read from the memory device 120. The ECC block 112 may detect and correct the error of the data stored in the memory device 120 through the ECC encoding and decoding operations.

The ECC block 112 may determine whether the detected error is a hard error or a soft error. The hard error and soft error may represent a hardware defect and a software defect occurring in a memory cell, respectively.

For example, the ECC block 112 determines whether the detected error is the hard error or the soft error based on persistency of the error. When a persistent error occurs in data, a corresponding memory cell may be qualified as a failed memory cell since the hardware defect occurs therein. When an error occurring in data is not persistent, a corresponding memory cell may be qualified as a weak memory cell since the software defect occurs therein. The ECC block 112 may perform a replay operation of repeatedly writing and reading data to check whether or not the error is persistent.

The memory controller 110 may further include an address detection block 114, and an address generation block 116. The address detection block 114 may detect an address of the data in which the error, that is, the soft error, is detected by the ECC block 112 as the first address ADD1. The address generation block 116 may generate the second address ADD2 based on the first address ADD1 detected by the address detection block 114.

The address generation block 116 may generate the second address ADD2 whose bit is different from a select or predetermined bit among a plurality of bits of the first address ADD1. When some bits among a plurality of bits comprising an address are the same as some bits among a plurality of bits comprising another address, the address generation block 116 may group the addresses into a single group. The address generation block 116 may select one address in the same group as the first address ADD1 and generate the selected address as the second address ADD2. The address generation block 116 may flip the select or predetermined bit among the plurality of bits of the first address ADD1 and generate the flipped bit as the second address ADD2.

FIG. 2 is a block diagram illustrating a memory device in accordance with an embodiment of the present invention, for example, the memory device 120 shown in FIG. 1. FIG. 2 representatively shows constituents related to an embodiment of the present invention among more constituents of the memory device 120. Referring to FIG. 2, the memory device 120 may include a command decoder 210, an address decoder 220, a latch 230, a memory cell array 240, and a sense amplifier 250.

The command decoder 210 may decode the commands CMD1 and CMD2 received from the memory controller 110 to generate an internal command ICMD. As described earlier, the first command CMD1 and the second command CMD2 may include the flag information in the set state and the reset state, respectively. The command decoder 210 may output a first flag signal FLAG1 in response to the flag information in the set state and output a second flag signal FLAG2 in response to the flag information in the reset state.

The address decoder 220 may decode the addresses ADD1 and ADD2 received from the memory controller 110 to generate an internal address IADD. The internal address IADD may include a row address. A word line of the memory cell array 240 may be selected based on the internal address IADD.

The latch 230 may selectively latch the internal address IADD generated from the address decoder 220. The latch 230 may latch the internal address IADD based on the first flag signal FLAG1. In addition, the latch 230 may output the latched internal address IADD as a latched address LADD in response to the second flag signal FLAG2.

The memory cell array 240 may include a plurality of word lines coupled to the memory cells. According to an embodiment of the present invention, when a weak memory cell (Weak MC) of the memory cell array 240 is written and read, a boost memory cell (Boost MC) may be written and read together. In other words, when a weak word line coupled to the weak memory cell (Weak MC) is activated (that is, "Weak WL ACT" in the drawing), a boost word line coupled to the boost memory cell (Boost MC) may be activated together (that is, "Boost WL ACT" in the drawing). To this end, when the internal address IADD corresponding to the Boost MC is generated from the address decoder 220, the latched address LADD corresponding to the Weak MC may be outputted from the latch 230. As the latched address LADD together with the internal address IADD is transmitted to the memory cell array 240, the weak word line and the boost word line may be activated simultaneously. The Weak MC and the Boost MC may be coupled to a single bit line sense amplifier (S/A) of the sense amplifier 250 through the same bit line.

Through the write and read operations subsequent to such an active operation, the bit line sense amplifier (S/A) may write and read data to and from the Boost MC together with the Weak MC. For example, even though charging and discharging characteristics of a charge deteriorate because capacitance of the Weak MC is low, the charge may be charged and discharged by means of capacitance of the Boost MC. Consequently, when the Weak MC is detected, it may be repaired thereby improving reliability of the data.

As described earlier, the first address ADD1 indicating the defective memory cell may be detected through the memory device 120. To this end, the memory device 120 may further include a refresh tester 260.

The refresh tester 260 may measure a retention time of the memory cells of the memory cell array 240. The refresh tester 260 may detect the defective memory cell based on the measured retention time, and store the address of the defective memory cell as the first address ADD1 in an address table 270.

The refresh tester 260 may measure the retention time during a power-on operation or a self-refresh operation. During the self-refresh operation of sequentially refreshing the memory cells, the refresh tester 260 may determine a target memory cell and skip a refresh operation. The refresh tester 260 may back up data of the target memory cell, and compare the backup data with data read from the target memory cell after skipping the refresh operation to check whether or not the target memory cell is defective. When the backup data is different from the read data, the refresh tester 260 may detect an address of the target memory cell and store the address as the first address ADD1.

According to an embodiment of the present invention, the memory controller 110 may receive the first address ADD1 stored in the address table 270 as read data DATA. When the memory controller 110 makes a read request through a command inputted to the memory device 120, the memory device 120 may transmit the first address ADD1 through a data line based on the corresponding internal command ICMD (that is, "DATA(ADD1)" in the drawing).

Figure 3:
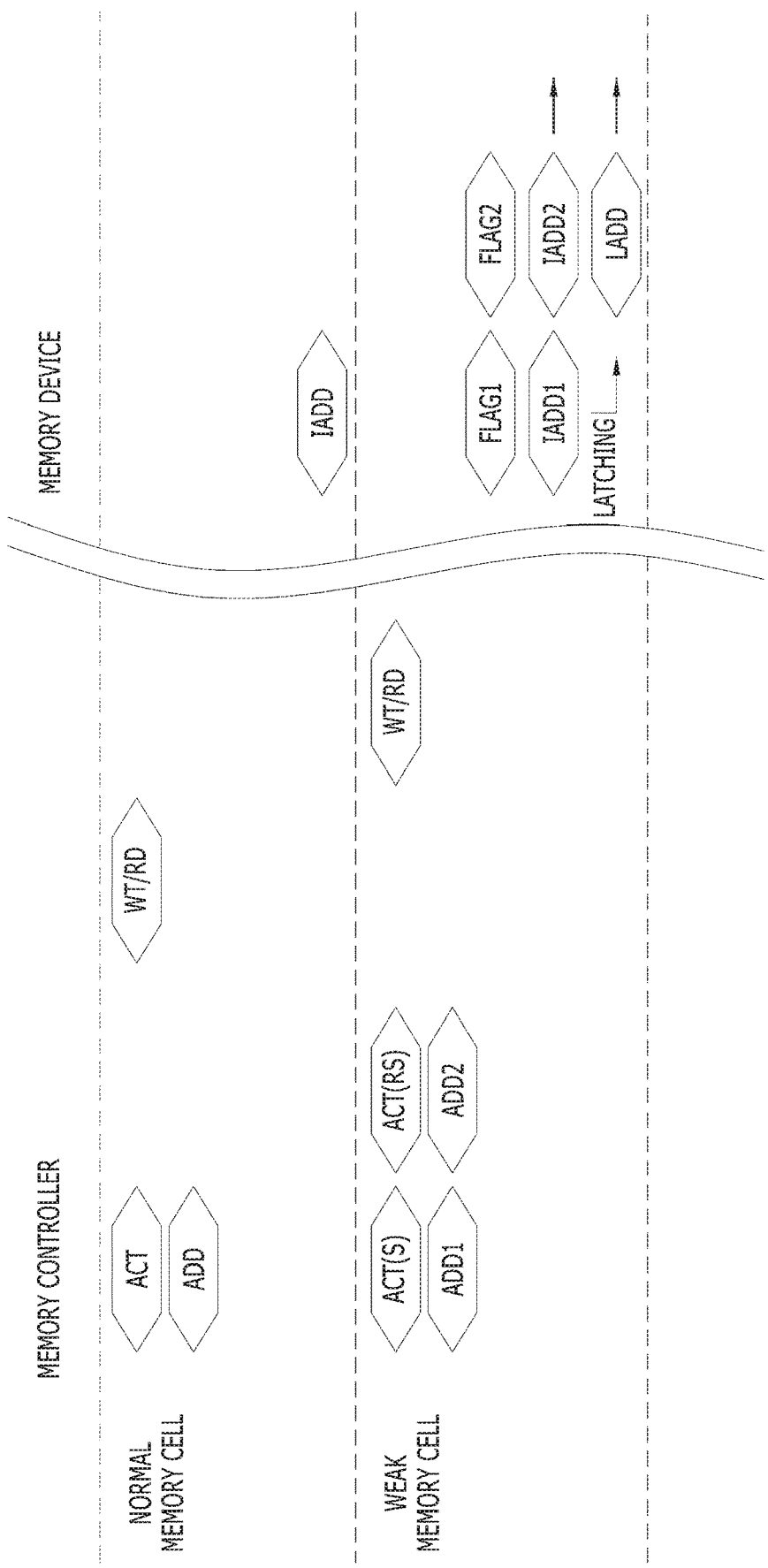
FIG. 3 is a timing diagram illustrating an operation of a memory system in accordance with an embodiment of the present invention.

FIG. 3 is a timing diagram illustrating an operation of a memory system in accordance with an embodiment of the present invention, for example, the memory system 100 shown in FIG. 1. A top and a bottom of FIG. 3 show timing of signals according to the write and read operations of a normal memory cell and the weak memory cell, respectively.

As for the write and read operations of the normal memory cell, the memory controller 110 may transmit a command ACT for the active operation together with the address ADD indicating the normal memory cell to the memory device 120. The address decoder 220 of the memory device 120 may decode the address ADD to generate the internal address IADD. The memory device 120 may activate a word line coupled to the normal memory cell based on the internal address IADD. When commands WT and RD indicating the write and read operations are received from the memory controller 110 after predetermined latency, the memory device 120 may performed the write and read operations on the normal memory cell coupled to the activated word line.

When the weak memory cell is detected due to continuous operations, the memory controller 110 may generate the second address ADD2 indicating the boost memory cell based on the first address ADD1 of the weak memory cell. Subsequently, during the write and read operations of the weak memory cell, the memory controller 110 may transmit a first command ACT(S) for the active operation together with the first address ADD1 to the memory device 120. In addition, the memory controller 110 may sequentially transmit a second command ACT(RS) for the active operation together with the second address ADD2 to the memory device 120.

The first command ACT(S) and the second command ACT(RS) may include flag information S in the set state and flag information RS in the reset state, respectively.

When the first command ACT(S) and the first address ADD1 are received, the command decoder 210 of the memory device 120 may decode the first command ACT(S) to generate an internal command (not illustrated) and the first flag signal FLAG1. The address decoder 220 may decode the first address ADD1 to generate a first internal address IADD1. The latch 230 may latch the first internal address IADD1 in response to the first flag signal FLAG1.

Subsequently, when the second command ACT(RS) and the second address ADD2 are received, the command decoder 210 may decode the second command ACT(RS) to generate an internal command (not illustrated) and the second flag signal FLAG2. The address decoder 220 may decode the second address ADD2 to generate a second internal address IADD2. The latch 230 may output the latched first internal address IADD1 as the latched address LADD in response to the second flag signal FLAG2.

The memory device 120 may activate the word line of the boost memory cell as well as the word line of the weak memory cell based on the latched address LADD and the second internal address IADD2. When commands WT and RD indicating the write and read operations are received from the memory controller 110 after predetermined latency, the memory device 120 may perform the write and read operations on the weak memory cell and boost memory cell coupled to the activated word lines.

During the write and read operations of the weak memory cell corresponding to the first address ADD1, the memory controller 110 may perform the write and read operations of the boost memory cell corresponding to the second address ADD2 as well. Accordingly, the memory controller 110 may sequentially transmit the first address ADD1 and the second address ADD2 to the memory device 120, and sequentially transmit the corresponding commands for the write and read operations, that is, the first active command ACT(S) and the second active command ACT(RS) to the memory device 120. An order of transmitting the first address ADD1 and the second address ADD2 or the first active command ACT(S) and the second active command ACT(RS) may vary in different embodiments of the present invention.

Figure 4:
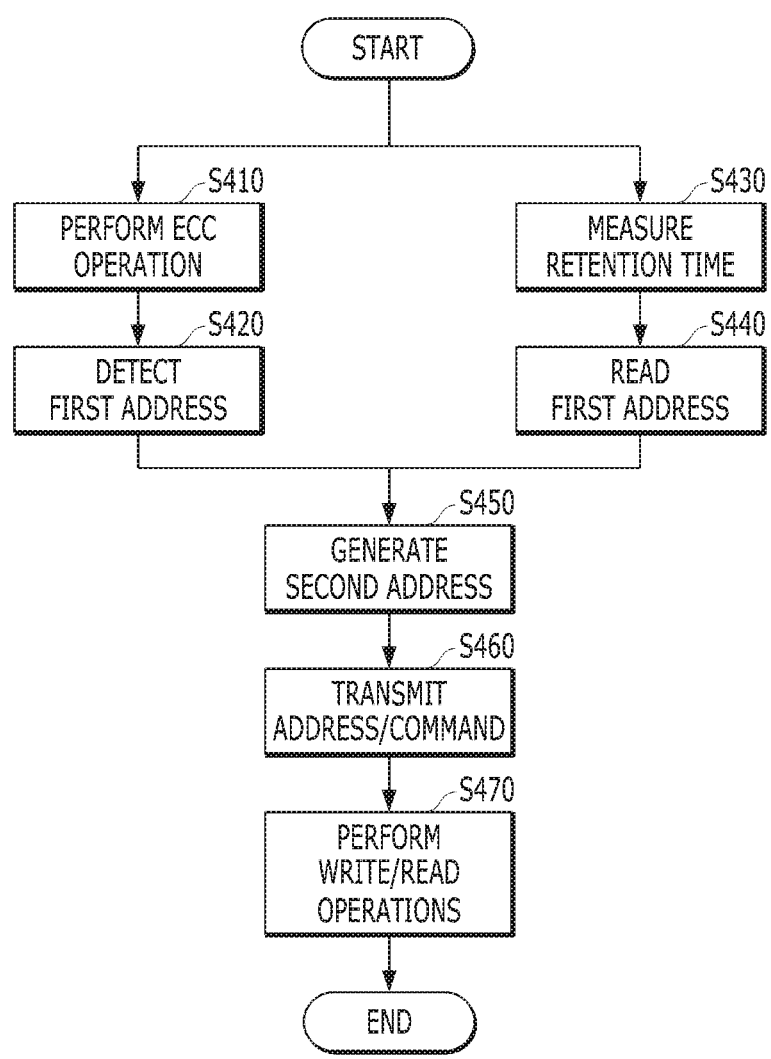
FIG. 4 is a flowchart illustrating an operation of a memory system in accordance with an embodiment of the present invention.

FIG. 4 is a flowchart illustrating an operation of a memory system in accordance with an embodiment of the present invention, for example, the memory system 100 of FIG. 1.

In some embodiments of the present invention, the memory controller 110 may detect the first address ADD1 indicating a defective memory cell among a plurality of memory cells of the memory device 120. To this end, at step S410, the ECC block 112 of the memory controller 110 may perform an ECC operation on data stored in the memory device 120 to detect an error. The ECC block 112 may determine whether the error detected by repeatedly performing the write and read operations on the data is the hard error or the soft error.

At step S420, the address detection block 114 of the memory controller 110 may detect an address of the data whose error is detected as the first address ADD1. The address detection block 114 may detect the address of the data which is determined as the soft error by the ECC block 112 as the first address ADD1.

In some embodiments of the present invention, the memory device 120 may detect the first address ADD1 indicating a defective memory cell among a plurality of memory cells. To this end, at step S430, the refresh tester 260 of the memory device 120 may measure a retention time of the memory cells to detect the defective memory cell. The refresh tester 260 may store an address of the detected defective memory cell as the first address ADD1 in the address table 270. In an idle mode where the write and read operations are not performed on the memory device 120, at step S440, the memory controller 110 may read the first address ADD1 from the memory device 120.

At step S450, the address generation block 116 of the memory controller 110 may generate the second address ADD2 based on the first address ADD1 indicating the defective memory cell among the plurality of memory cells of the memory device 120. The address generation block 116 may generate the second address ADD2 whose bit is different from a predetermined bit among a plurality of bits of the first address ADD1. The address generation block 116 may flip the predetermined bit among the plurality of bits of the first address ADD1 to generate the second address ADD2.

At step S460, during the write and read operations of the defective memory cell, the memory controller 110 may transmit the first address ADD1 and the first command CMD1 corresponding to the first address ADD1 to the memory device 120, and sequentially transmit the second address ADD2 and the second command CMD2 corresponding to the second address ADD2 to the memory device 120. The first command CMD1 and the second command CMD2 may include flag information in the set state and flag information in the reset state, respectively.

At step S470, the memory device 120 may write and read the data to and from the defective memory cell in response to the first address and command ADD1 and CMD1 and the second address and command ADD2 and CMD2 which are sequentially received. The command decoder 210 of the memory device 120 may decode the first and second commands CMD1 and CMD2 to generate the internal command ICMD, and may output the first and second flag signals FLAG1 and FLAG2 in response to the flag information in the set state and the flag information in the reset state, respectively.

The address decoder 220 of the memory device 120 may decode the first and second addresses ADD1 and ADD2 to generate the internal address IADD. The latch 230 may latch the internal address IADD in response to the first flag signal FLAG1, and output the latched address LADD in response to the second flag signal FLAG2.

Accordingly, the memory device 120 may activate a word line of the defective memory cell based on the latched address LADD, and simultaneously activate another word line based on the internal address IADD. The memory system 100 in accordance with embodiments of the present invention may write and read data to and from other memory cells while writing and reading data to and from the defective memory cell of the memory device 120, whereby deteriorated characteristics of the defective memory cell may be compensated.

In accordance with embodiments of the present invention, a memory system may compensate for low or degraded capacitance of a memory cell of a memory device. When a memory controller of the memory system accesses a memory cell whose capacitance is relatively low, the memory controller may also access another memory cell sharing a bit line sense amplifier with the memory cell. Consequently, the capacitance of the memory cell may increase.

To this end, the memory controller may sequentially transmit an address of the memory cell and an address of another memory cell to the memory device so as to control the memory device to access a plurality of memory cells. The capacitance of the memory cells may be compensated without an effect on the degree of integration of the memory device. Accordingly, a refresh cycle of the memory device may increase or refresh power consumption may decrease.

While the present invention has been described with respect to specific embodiments, these embodiments are not intended to be restrictive, but rather descriptive. Further, it is noted that the present invention may be achieved or implemented in various ways through substitution, change, and modification by those skilled in the art without departing from the spirit and/or scope of the present invention as defined by the following claims.

What is claimed is:

1. A memory system, comprising:
   a memory device including a plurality of memory cells; and
   a memory controller configured to generate a second address based on a first address indicating a defective memory cell, among the plurality of memory cells, and sequentially transmit the first address and a first command corresponding to the first address, and the second address and a second command corresponding to the second address to the memory device to control the memory device to perform a write or read operation of the defective memory cell.

2. The memory system of claim 1, wherein the first command includes flag information in a set state and the second command includes flag information in a reset state.

3. The memory system of claim 2, wherein the memory device includes:
   a command decoder configured to decode the first and second commands to generate an internal command, and output first and second flag signals in response to the flag information in the set state and the flag information in the reset state, respectively;
   an address decoder configured to decode the first and second addresses to generate an internal address; and
   a latch configured to latch the internal address in response to the first flag signal, and output the latched internal address as a latched address in response to the second flag signal.

4. The memory system of claim 3, wherein the memory device further includes a memory cell array including a plurality of word lines, and when a first word line, among the plurality of word lines, is activated in response to the latched address, a second word line, among the plurality of word lines, is simultaneously activated in response to the internal address.

5. The memory system of claim 4, wherein memory cells respectively corresponding to the first and second word lines share a bit line sense amplifier.

6. The memory system of claim 1, wherein the memory controller includes an address generation block for generating the second address by changing a select bit of a plurality of bits of the first address.

7. The memory system of claim 1, wherein the memory controller includes:
   an error correction code (ECC) block configured to perform an ECC operation on data stored in the memory device to detect an error; and
   an address detection block configured to detect an address of data having the error detected as the first address.

8. The memory system of claim 5, wherein the ECC block repeatedly performs write and read operations on the data having the error detected, and determines whether the detected error is a hard error or a soft error.

9. The memory system of claim 1, wherein the memory device includes a refresh tester for measuring a retention time of the memory cells to detect the defective memory cell and storing an address of the detected defective memory cell as the first address.

10. The memory system of claim 1, wherein the memory controller reads the first address from the memory device in an idle mode.

11. An operating method of a memory system, comprising:
   generating a second address based on a first address indicating a defective memory cell among a plurality of memory cells in a memory device;
   sequentially transmitting the first address and a first command corresponding to the first address, and the second address and a second command corresponding to the second address to the memory device to control the memory device to perform a write or read operation of the defective memory cell; and
   writing and reading data to and from the defective memory cell in response to the first address and command and the second address and command which are sequentially inputted.

12. The operating method of claim 11, wherein the first command includes flag information in a set state and the second command includes flag information in a reset state.

13. The operating method of claim 12, wherein the writing and reading of the data to and from the defective memory cell includes:
   decoding the first and second commands to generate an internal command, and outputting first and second flag signals in response to the flag information in the set state and the flag information in the reset state, respectively;
   decoding the first and second addresses to generate an internal address; and
   latching the internal address in response to the first flag signal, and outputting the latched internal address as a latched address in response to the second flag signal.

14. The operating method of claim 13, wherein the writing and reading of the data to and from the defective memory cell further includes:
   activating a word line of the defective memory cell in response to the latched address, and simultaneously activating another word line in response to the internal address.

15. The operating method of claim 11, wherein the generating of the second address includes: changing a select bit of a plurality of bits of the first address.

16. The operating method of claim 11, further comprising:
   performing an error correction code (ECC) operation on data stored in the memory device to detect an error; and
   detecting an address of data having the error detected as the first address.

17. The operating method of claim 16, wherein further comprising:
   repeatedly performing write and read operations on the data having the error detected; and
   determining whether the detected error is a hard error or a soft error.

18. The operating method of claim 11, further comprising:
   measuring a retention time of the memory cells to detect the defective memory cell; and
   storing an address of the detected defective memory cell as the first address.

19. The operating method of claim 18, further comprising:
   reading the first address from the memory device in an idle mode.

* * * * *